(12) United States Patent
Yang et al.

(10) Patent No.: US 11,609,290 B2
(45) Date of Patent: Mar. 21, 2023

(54) INTEGRATED WATER AND AIR COOLING SYSTEM IN MRI

(71) Applicant: Siemens Healthcare GmbH, Erlangen (DE)

(72) Inventors: Hai Ying Yang, Shenzhen (CN); Ping Chen, Shenzhen (CN)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 17/367,407

(22) Filed: Jul. 4, 2021

(65) Prior Publication Data

US 2022/0003827 A1    Jan. 6, 2022

(30) Foreign Application Priority Data

Jul. 6, 2020 (CN) .......................... 202010638453.2

(51) Int. Cl.
*G01R 33/38* (2006.01)
*H05K 7/20* (2006.01)

(52) U.S. Cl.
CPC ....... *G01R 33/3804* (2013.01); *H05K 7/2089* (2013.01)

(58) Field of Classification Search
CPC .... G01R 33/3804; G01R 33/28; G01R 33/48; H05K 7/20927; H05K 7/20781;
(Continued)

(56) References Cited

U.S. PATENT DOCUMENTS 5,725,047 A * 3/1998 Lopez ............... F28F 9/013
165/149
6,927,980 B2 * 8/2005 Fukuda ............... G11B 33/142
(Continued)

FOREIGN PATENT DOCUMENTS

CN     202309486 U    7/2012
JP     2014135991 A   7/2014

OTHER PUBLICATIONS

K. Nemati, B. T. Murray and B. Sammakia, "Experimental characterization and modeling of a water-cooled server cabinet," Fourteenth Intersociety Conference on Thermal and Thermomechanical Phenomena in Electronic Systems (ITherm), 2014, pp. 723-728 (Year: 2014).*

(Continued)

*Primary Examiner* — Daniel R Miller
(74) *Attorney, Agent, or Firm* — Banner & Witcoff Ltd.

(57) ABSTRACT

MRI system cabinet having a cabinet body with electronics and a water cooler with a water cooling loop. The water cooling loop divides the cabinet body into first and second cabinet spaces, and the electronics are along the first and second cabinet spaces. An air cooler is along the central axis of the water cooler and has a fan. A cooling cycle is formed where, on a first side, the fan generates a first air flow, which is sent to the first cabinet space through a first air path, and a second air flow, which is sent to the second cabinet space through a second air path. After flowing through the first and second cabinet spaces, the first and second air flows are guided into the water cooling loop for heat exchange under the suction action of the fan on a second side, and then directed into the air cooler.

8 Claims, 2 Drawing Sheets

(58) Field of Classification Search
CPC .. H05K 7/2079; H05K 7/20763; H05K 7/206; H05K 7/20745; H05K 7/20609; H05K 7/20218; H05K 7/20872; G06F 2200/201
See application file for complete search history.

(56) References Cited

U.S. PATENT DOCUMENTS

| | | | | |
|---|---|---|---|---|
| 7,430,118 | B1* | 9/2008 | Noteboom | H05K 7/1488 165/122 |
| 2005/0217299 | A1 | 10/2005 | Chu et al. | |
| 2007/0289324 | A1 | 12/2007 | Suzuki et al. | |
| 2008/0055846 | A1* | 3/2008 | Clidaras | H05K 7/2079 361/679.41 |
| 2009/0086428 | A1 | 4/2009 | Campbell et al. | |
| 2009/0154091 | A1* | 6/2009 | Yatskov | H05K 7/2039 165/104.33 |
| 2012/0127657 | A1* | 5/2012 | Keisling | F28D 15/00 361/679.53 |

OTHER PUBLICATIONS

Search Report dated Nov. 21, 2021 for European Patent Application No. 21183711.7.

* cited by examiner

INTEGRATED WATER AND AIR COOLING SYSTEM IN MRI

TECHNICAL FIELD

The present disclosure relates to the technical field of medical devices, and in particular to a cabinet for use in a magnetic resonance imaging system and a magnetic resonance imaging system.

BACKGROUND

Magnetic resonance imaging (MRI) is a medical imaging technique that uses strong magnetic fields, gradient magnetic fields and radio waves to form images of tissues and organs in the human body in order to identify lesions and study the physiological processes in the body. It uses magnetic fields and radio frequency pulses to make the moving and self-spinning protons in human tissues, mainly hydrogen nuclei (i.e. H+), resonate to generate radio frequency signals, and uses T1 and T2 relaxation signals to form comparable images and analyze the composition of the body tissues and identify lesions. Specifically, when an object or human body is placed in a magnetic field and irradiated with a high-frequency radio wave at an appropriate frequency, and then the relaxed electromagnetic signal is received by a radio frequency signal receiving device, the location and type of the substances composing the object or body may become known, based on which an accurate image of the composition of the inside of the object or body can be obtained.

An MRI system consists of many subunits. For the installation of an MRI system, a number of special rooms have to be provided, including: an examination room, a control room, an equipment room, etc. Multiple subunits in an MRI system, including the gradient amplifier (or gradient power amplifier), radio frequency power amplifier, etc., are heat sources that generate a lot of heat during the operation of the MRI system. Of course, an MRI system is not limited to the above subunits, but also comprises digital processing circuits such as electrical and electronic components, a central processing unit (CPU), memory, etc. Based on some technical standards, it is necessary to control the ambient temperature of the subunits of an MRI system, and also to consider the space occupied by the subunits of the MRI system.

SUMMARY

In view of this, the present disclosure provides a cabinet, used for installing electronic components of an MRI system. The cabinet comprises: a cabinet body, which has a plurality of electronic components installed in it; the cabinet further comprises: a water cooling device, comprising a water cooling loop, constructed in the cabinet body, wherein the water cooling loop divides the cabinet body into a first cabinet space and a second cabinet space and the electronic components are arranged along the first cabinet space and the second cabinet space; an air cooling device, arranged in the cabinet and constructed along the central axis of the water cooling device, and comprising at least a fan, wherein, on a first side, the fan generates a first air flow, which is sent to the first cabinet space through a first air path, and a second air flow, which is sent to the second cabinet space through a second air path; after at least the first air flow flows through the first cabinet space and/or the second air flow flows through the second cabinet space, they are guided into the water cooling loop for heat exchange under the suction action of the fan on a second side, and then the first air flow and/or the second air flow are directed into the air cooling device after heat exchange with the water cooling loop.

Optionally, the cabinet further comprises: a cooling cabinet, which provides cooling to the plurality of electronic components installed in the cabinet body and has the water cooling loop and the air cooling device installed in it, wherein at least two first openings are opened in the cooling cabinet on both sides of the fan, and the cooling cabinet is connected respectively to the first cabinet space and the second cabinet space through the first openings to form the first air path and the second air path; at least one second opening is opened on either side of the cooling cabinet at the inlet end of the water cooling loop, so that the first air flow and the second air flow can pass through the second opening and enter the inlet end.

Optionally, the water cooling loop and the fan are sequentially arranged in the cabinet body from top to bottom, an inlet end is opened on the top of the water cooling loop, an outlet end is opened at the bottom of the water cooling loop, and the fan is arranged according to the position of the outlet end so that the first air flow and/or the second air flow generated by the fan are/is introduced into the first cabinet space and/or the second cabinet space from the bottom of the cabinet body, and enter(s) the water cooling loop from the top of the cabinet body through the inlet end of the water cooling loop for heat exchange.

Optionally, the air cooling device further comprises: a heat exchanger, which is arranged between the fan and the outlet end of the water cooling loop, has a cross section the same size as that of the cooling cabinet, and separates the fan from the water cooling loop so that the first air flow and/or the second air flow are/is introduced into the heat exchanger after passing through the water cooling loop, and so that the first air flow and/or the second air flow are/is directed back to the fan from the heat exchanger.

Optionally, the heat exchanger and the water cooling loop are interconnected by a removable connector.

Optionally, the fan is configured to suck air flow from the side facing the heat exchanger and delivers the air flow to the side facing away from the heat exchanger.

Optionally, the cabinet further comprises: a power distribution system, installed in the first cabinet space or the second cabinet space, wherein the fan is electrically connected to the power distribution system through a pluggable electrical connection line, and the power distribution system supplies power to the fan.

In another aspect, the present disclosure further provides an MRI system. The MRI system comprises: the cabinet described above, wherein the gradient power amplifier included in the MRI system is independently placed in the first cabinet space or the second cabinet space.

One advantage of the present disclosure is that, by arranging a combination of the water cooling device and the air cooling device in the middle of the cabinet, the cooling of the electronic components of the MRI system placed on both sides can be balanced, and the installation of the water cooling device and the air cooling device in a single cabinet results in a more compact structure, and thus a smaller-sized cabinet.

Another advantage of the present disclosure is that the first air flow and the second air flow at a lower temperature generated at the bottom by the air cooling device flow through the cabinet spaces on both sides respectively, are guided into the water cooling loop of the water cooling device as a heat exchange medium, and then return to the air cooling device, thus forming two cooling loops and improving the cooling efficiency.

BRIEF DESCRIPTION OF THE DRAWINGS

The aspects of the present disclosure will be described in detail below with reference to the drawings so that those skilled in the art will better understand the above and other features and advantages of the present disclosure. In the drawings.

Figure 1:
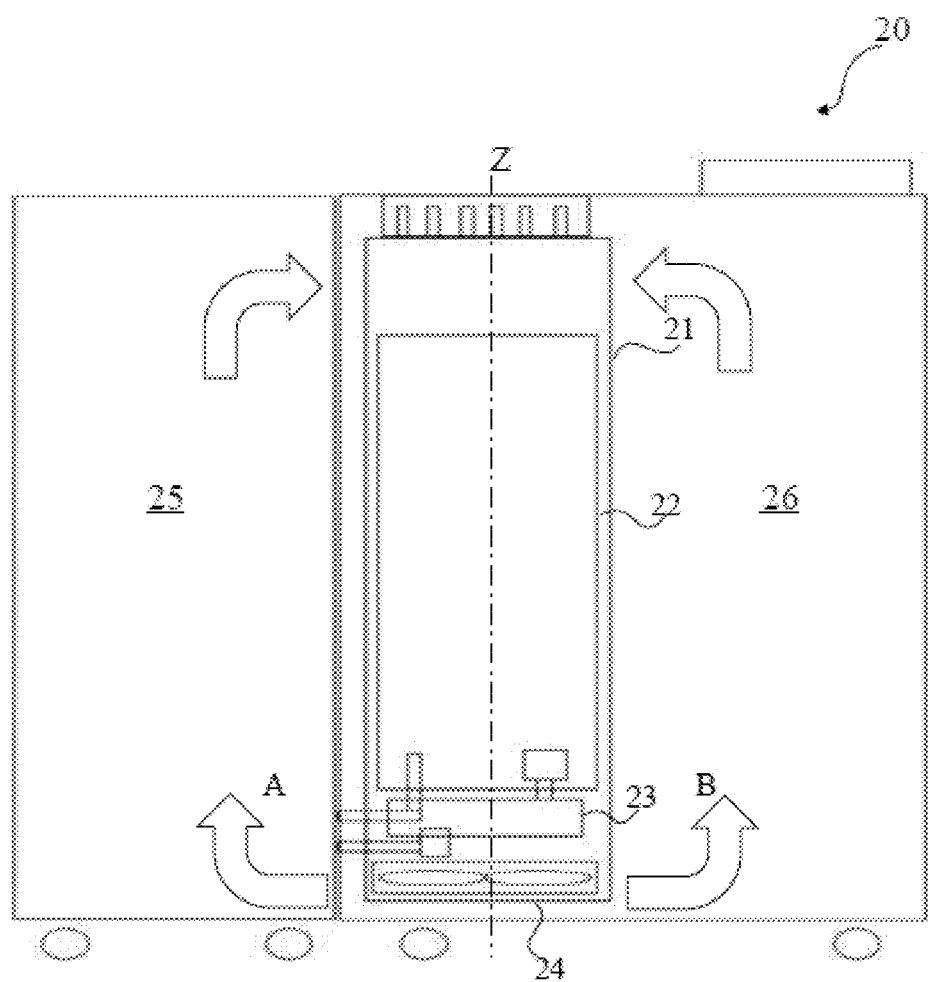
FIG. 1 is a schematic diagram showing the structure of the cabinet for an MRI system according to an exemplary aspect.

In the drawings, the following symbols are used:
100 MRI system
1 Magnet component
1X X-axis gradient coil
1Y Y-axis gradient coil
1Z Z-axis gradient coil
1T Transmitting coil
1M Magnet
1R Receiving coil
20 Cabinet
21 Cooling cabinet
22 Water cooling loop
23 Heat exchanger
24 Fan
25 First cabinet space
26 Second cabinet space
3X X-axis gradient coil drive
3Y Y-axis gradient coil drive
3Z Z-axis gradient coil drive
4 Radio frequency amplifier
5 Pre-amplifier
6 Computer
7 Impulse sequence memory
8 Gate modulator
9 Radio frequency oscillator
10 Analog-digital converter
11 Phase detector
A First air flow
B Second air flow

DETAILED DESCRIPTION

In order to have a clearer understanding of the technical features, purpose and effects of the present disclosure, the specific aspects of the present disclosure will be described below with reference to the drawings. In the drawings, the same reference numerals represent the same parts.

Here, "exemplary" means "serving as an example, instance or illustration", and any illustration or aspect described as "exemplary" here may not be construed as a more preferred or advantageous technical solution.

For simplification, the drawings only schematically show the parts related to the present disclosure, and do not represent the actual structure of a product. In addition, in order to make the drawings simple and easy to understand, only one of the parts of the same structure or function in some drawings is shown as an example, or only one of them is indicated.

Here, "one" not only means "only this one", but may also mean "more than one". Here, "first", "second", etc. are only used to distinguish them from each other, rather than indicating their importance and order, or being the premise of the existence of one another, etc.

For the installation of MRI equipment, a number of special spaces are generally involved, including: an examination room, a control room, an equipment room, etc. In terms of space requirements, the cabinets of MRI equipment tend to be designed to be more compact, which puts forward new requirements in relation to the cooling devices of MRI equipment.

In a typical configuration shown, an independent cooling cabinet is used to provide the cooling water loop, and the air cooling system (ACS) and the electronic and power cabinet (EPC) are integrated in another separate cabinet. Specifically, in the cabinet, the air cooling system is arranged between the gradient power amplifier (GPA) and the electronic and power cabinet. The air cooling system can comprise multiple fans. The fans can introduce external air flow into the cabinet from the top of the cabinet, and respectively guide the air flow to the electronic and power cabinet and the gradient power amplifier to provide air cooling. The electronic and power cabinet comprises at least one radio frequency power amplifier (RFPA). The gradient power amplifier is used to provide current to gradient coils, while the radio frequency power amplifier, as an important component of MRI equipment, provides suitable radio frequency pulse signals for the transmitting coils. The above two electronic components are relatively important heat sources in the MRI equipment, and need to be provided with heat dissipation and cooling to ensure their normal working status and performance. In addition, the independent cooling cabinet comprises at least a heat exchanger and a magnet refrigerator (MREF). The heat exchanger is connected with the magnet refrigerator to provide refrigeration for the fluid in the cooling water loop. The above structure requires multiple independent cabinets and takes up a lot of space.

In another configuration shown, an independent cooling cabinet for the cooling water loop can be used in combination with an electrical cabinet (ECA). The air cooling system and the water cooling system are integrated in one cooling cabinet. The water cooling system comprises at least a magnet refrigerator and passive cooling equipment, and is configured to cool a cooling water loop. In the configuration shown, a channel for air flow convection is provided between one side of the electrical cabinet and the cooling cabinet for heat exchange by convection between the electrical cabinet and the cooling cabinet. However, the electrical cabinet can be construed as the installation of a number of electronic components involved in the MRI equipment in a stack. The electrical cabinet comprises: a gradient power amplifier, a gradient small signal unit (GSSU), a radio frequency small unit (RFSU), a measurement and reconstruction system (MARS), a radio frequency power amplifier, a power distribution system (PDS), an e-shim power supply, etc., stacked or arranged in a certain form. In this configuration, the convection in the electrical cabinet is not sufficient, resulting in uneven temperature distribution.

The present disclosure provides a cabinet for placing the electronic components of MRI equipment and providing cooling and heat dissipation for a plurality of electronic components. The cabinet integrates a water cooling device and an air cooling device to cool and dissipate heat of the electronic components in the cabinet, and the water cooling device and the air cooling device are arranged in the middle of the cabinet to divide the cabinet into two parts so that the plurality of electronic components and the units of the MRI equipment are arranged along each side of the water cooling device and the air cooling device. A cooling cycle is formed, where the air cooling device generates an air flow at a low temperature at the bottom and delivers it to the cabinet spaces on both sides, the air flows at higher temperatures on both sides enter the water cooling loop of the water cooling device under the suction action of the air cooling device at the bottom for heat exchange, and finally return to the air cooling device. Thanks to the above structure, the cabinet is compact and takes up a small space, and it has a high cooling efficiency and more even cooling effect for the electronic components of the MRI equipment.

A cabinet of the present disclosure will be described below with reference to the drawings.

FIG. 1 is a schematic diagram showing the structure of the cabinet for accommodating and cooling the electronic components of an MRI system according to an exemplary aspect.

As shown in FIG. 1, the cabinet 20 comprises: a cabinet body, which has at least a plurality of electronic components installed in it; the cabinet 20 further comprises: a water cooling device, comprising a water cooling loop 22, constructed in the cabinet body, wherein the water cooling loop 22 divides the cabinet body into a first cabinet space 25 and a second cabinet space 26, and the electronic components are arranged along the first cabinet space 25 and the second cabinet space 26; an air cooling device, arranged in the cabinet body and constructed along the central axis Z of the water cooling device, and comprising at least a fan 24 constructed in the cabinet 20, wherein, on a first side, the fan 24 generates a first air flow A, which is sent to the first cabinet space through a first air path, and a second air flow B, which is sent to the second cabinet space through a second air path; after at least the first air flow A flows through the first cabinet space and/or the second air flow B flows through the second cabinet space, they are guided into the water cooling loop 22 for heat exchange, and then the first air flow A and/or the second air flow B are/is directed into the air cooling device after flowing through the water cooling loop 22. According to the above structure, a cooling cycle can be formed in the cabinet 20.

Through the above structure, the cabinet 20 is divided into the first cabinet space 25 and the second cabinet space 26 by the water cooling device, and the electronic components involved in the MRI system are placed along the two sides of at least the water cooling device, which can better optimize the cooling efficiency in the cabinet 20 and make the temperature distribution in the cabinet 20 more even. Taking the memory and the gradient power amplifier among the electronic components of an MRI system as an example, the heat generated by the gradient power amplifier is several times that of the memory. For this reason, the first cabinet space 25 can be used as a unit for the gradient power amplifier, and the second cabinet space 26 as a place for the electronic and power components of the MRI system. The electronic and power components may include a radio frequency power amplifier and a computer, comprising a reconstruction system, a transmitting unit, a receiving unit, a power distribution system, an E-shim power supply, etc. The transmitting unit may comprise a radio frequency small unit, a pulse sequence memory, a radio frequency oscillator, a gate modulator, etc. The receiving unit may comprise a pre-amplifier, a phase detector, an analog-to-digital converter, etc.

According to some aspects, the water cooling loop 22 may comprise some cooling water circulation pipelines and a heat exchanger for heat exchange, and the cooling water pipelines may be arranged along the heat exchanger and in contact with it. The water cooling device may further comprise: driving devices such as motors and pumps that drive the water cooling cycle in the water cooling loop 22, and a device that refrigerates the water cooling cycle. The refrigeration device may be based on, without limitation to, the thermoelectric or compression type.

According to some aspects, the fan 24 used to generate the first air flow A and the second air flow B in the air cooling device may also be replaced by a blower, and it is not limited to a fan in this aspect.

According to some aspects, the water-cooling loop 22 may also be provided with an inlet end that guides the first air flow A and/or the second air flow B into the water cooling loop 22 for heat exchange, and an outlet end that discharges the air flow entering the water cooling loop 22 from the water cooling loop 22 after heat exchange.

According to some aspects, in order to integrate the water cooling device and the air cooling device compactly in the cabinet 20, the cabinet further comprises: a cooling cabinet 21, the cooling cabinet 21 providing cooling to the plurality of electronic components installed in the cabinet body and having the water cooling loop 22 and the air cooling device installed in it, wherein at least two first openings are opened in the cooling cabinet 21 on both sides of the fan 24, and the cooling cabinet 21 is connected respectively to the first cabinet space 25 and the second cabinet space 26 through the first openings to form the first air path and the second air path; at least one second opening is opened on either side of the cooling cabinet 21 at the inlet end of the water cooling loop 22 so that the first air flow A and the second air flow B can pass through the second opening and enter the inlet end.

According to some aspects, in order to optimize the cooling efficiency of the air cooling device and the water cooling device, the water cooling loop 22 and the fan 24 are sequentially arranged in the cabinet body from top to bottom, an inlet end is opened on the top of the water cooling loop 22, an outlet end is opened at the bottom of the water cooling loop 22, and the fan 24 is arranged according to the position of the outlet end so that the first air flow A and/or the second air flow B generated by the fan 24 are/is introduced into the first cabinet space 25 and/or the second cabinet space 26 from the bottom of the cabinet body, and enter(s) the water cooling loop 22 from the top of the cabinet body through the inlet end of the water cooling loop 22 for heat exchange. The fan 22 conveys the first air flow A and the second air flow B at low temperatures to the first cabinet space 25 and the second cabinet space 26 through the first air path and the second air path from the bottom. After the above air flows go through the first cabinet space 24 and the second cabinet space on the two sides of the cabinet and absorb part of the heat generated by the electronic components of the MRI system, such as the gradient power amplifier, power components, electronic devices, etc., the temperatures of the first air flow A and the second air flow B are relatively high when reaching the top of the cabinet body. Under the suction action of the fan 24 at the bottom, the first air flow A and the second air flow B at higher temperatures are guided into the water cooling loop 22 through the inlet end opened at the top of the water cooling loop 22, then the first air flow A and the second air flow B exchange heat with the water cooling loop 22 to lower their temperatures, and then they are introduced into the air cooling device to form a cooling cycle. The cooling efficiency of the cabinet 22 is thus improved.

According to some aspects, in order to optimize the cooling efficiency of the cooling cycle and ensure that the fan 24 transports the first air flow A and the second air flow B from the bottom and sucks air of higher temperatures from the top, the air cooling device further comprises: a heat exchanger 23, the heat exchanger 23 is arranged between the fan 24 and the outlet end of the water cooling loop 22, and the heat exchanger 23 has a cross section the same size as that of the cooling cabinet 21, and the heat exchanger 23 separates the fan 24 from the water cooling loop 22 so that the first air flow A and/or the second air flow B are/is introduced into the heat exchanger 23 after passing through the water cooling loop 22, and so that the heat exchanger 23 guides the first air flow A and/or the second air flow B back to the fan 24.

According to some aspects, the fan 22 is configured to suck air flow from the side facing the heat exchanger 23 and deliver the air flow to the side facing away from the heat exchanger 23.

According to some aspects, the heat exchanger 23 and the water cooling loop 22 are interconnected by a removable connector.

According to some aspects, in order to optimize the maintenance of the cabinet 20, the cabinet 20 further comprises: a power distribution system, the power distribution system being installed in the first cabinet space 25 or the second cabinet space 26, and the fan 24 being electrically connected to the power distribution system through a pluggable electrical connection line so that the power distribution system supplies power to the fan 24. The power distribution system can simplify the daily maintenance of the cabinet 20 and makes it possible to plug/unplug the fan 24 into/from the power distribution system, so that it is unnecessary to shut down the power system of the entire cabinet 20 during maintenance of the fan 24. The power distribution system can not only be connected to the fan 24, but can also be connected and supply power to the water cooling device, and is not limited thereto in this aspect.

Figure 2:
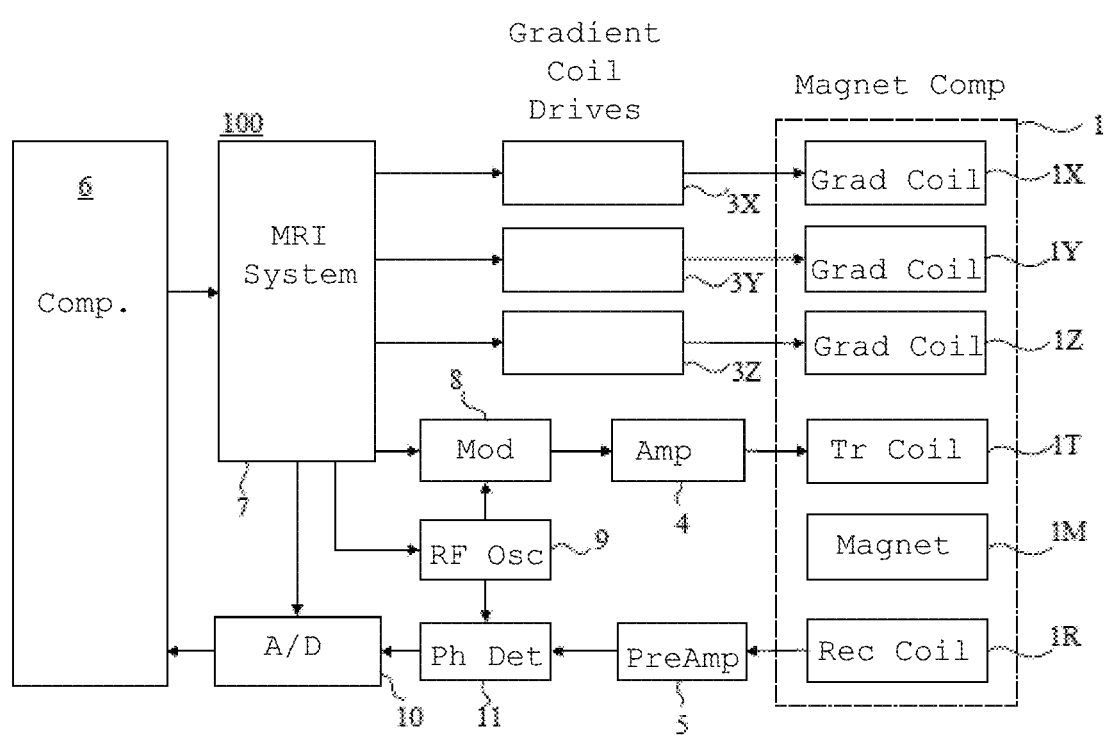
FIG. 2 is a functional block diagram of the MRI system according to an exemplary aspect.

FIG. 2 is a functional block diagram of the MRI system 100 according to an exemplary aspect.

As shown in FIG. 2, in the MRI system, the magnet component 1 may comprise: a space part (such as a magnetic resonance chamber) to hold an object or patient so that the space part surrounds the object or patient; an X-axis gradient coil 1X, used to generate an X-axis gradient magnetic field, a Y-axis gradient coil 1Y, used to generate a Y-axis gradient magnetic field, a Z-axis gradient coil 1Z, used to generate a Z-axis gradient magnetic field, a transmitting coil 1T, used to provide radio frequency pulses to excite the spin of atomic nuclei in the object, a receiving coil 1R, used to detect the magnetic resonance signal generated from the object, wherein the magnetic resonance signal has the characteristic of the Larmor frequency, and a magnet 1M, used to form a static magnetic field.

The X-axis gradient coil 1X, Y-axis gradient coil 1Y, Z-axis gradient coil 1Z and transmitting coil 1T are respectively connected with an X-axis gradient coil drive 3X, Y-axis gradient coil drive 3Y, Z-axis gradient coil drive 3Z, and radio frequency power amplifier 4, wherein the X-axis gradient coil drive 3X, Y-axis gradient coil drive 3Y, Z-axis gradient coil drive 3Z, and radio frequency power amplifier 4 respectively comprise an X-axis gradient amplifier, a Y-axis gradient amplifier, a Z-axis gradient amplifier, and a radio frequency amplifier. It should be noted that a gradient power amplifier may comprise an X-axis gradient coil drive 3X, a Y-axis gradient coil drive 3Y, and a Z-axis gradient coil drive 3Z.

According to an instruction sent by the computer 6, a pulse sequence memory 7 receives the instruction for the gradient coil drives 3X, 3Y and 3Z to drive the gradient coils 1X, 1Y and 1Z to generate gradient magnetic fields based on the stored pulse sequence and at the same time operates a gate modulator 8 to modulate the carrier control signal provided by a radio frequency oscillator 9 to obtain a pulse signal with a preset time sequence, a preset envelope waveform and a preset phase. Then the pulse signal is sent as a radio frequency pulse to the radio frequency power amplifier 4, where its power is amplified, and then the amplified signal is applied to the transmitting coil 1T.

The receiving coil 1R is connected to a pre-amplifier 5. The pre-amplifier 5 amplifies the magnetic resonance signal received by the receiving coil 1R from the object and then inputs it to a phase detector 11. According to the reference signal output from the radio frequency oscillator 9, the phase detector 11 detects the phase of the magnetic resonance signal provided by the pre-amplifier 5, and then provides the detected signal to the analog-to-digital converter 10. The analog-to-digital converter 10 converts a phase-detected analog signal into a digital signal and inputs the digital signal to the computer 6.

The computer 6 is responsible not only for the control of the entire system and receiving input control signals from the operation controls, but also for reading digitized data from the analog-to-digital converter 10 and generating images by use of arithmetic operations including the inverse Fourier transform.

An MRI system 100 provided in another aspect of the present disclosure comprises: a cabinet 20, wherein the gradient power amplifier comprised in the MRI system 100 is independently placed in the first cabinet space 25 or the second cabinet space 26.

According to an aspect shown, the gradient power amplifier is used as a gradient power amplification unit, and the X-axis gradient coil drive 3X, Y-axis gradient coil drive 3Y, and Z-axis gradient coil drive 3Z can be contained in the gradient power amplification unit and placed in the first cabinet space 25. In addition, the gradient power amplification unit may further comprise a gradient small signal unit, etc. The second cabinet space 26 can be used to accommodate the electronic and power components in the MRI system. The electronic and power components may include the following main units: a transmitting unit, which may comprise at least a pulse sequence memory 7, a gate modulator 8, a radio frequency oscillator 9, etc., and may also comprise other devices, such as a radio frequency small unit, a receiving unit, a pre-amplifier 5, a phase detector 11, an analog-to-digital converter 10, a power distribution system, an e-shim power supply, a radio frequency power amplifier 4, etc. Separate placement of the electronic and power components and the gradient power amplifier/amplification unit in the first cabinet space 25 and the second cabinet space 26 can balance the heat generated by the electronic components of the MRI system and cool them more effectively. In addition, this aspect does not limit the specific arrangement of other electronic components of the MRI system in the cabinet 20, and the electronic components of the MRI system may be reasonably arranged in the cabinet 20 based on the actual conditions.

In addition, the heat exchange medium of the water cooling loop of the water cooling device involved in the present disclosure is not limited to water, but may also be other liquids, such as propylene glycol or ethylene glycol.

In addition, the cabinet involved in the present disclosure can be used not only as a cabinet for an MRI system, but also as a cabinet for other medical imaging systems, such as a computed tomography system, a positron emission tomography system, etc., and can also be used as a cabinet for other large-scale electronic equipment or systems that require a cooling function.

The above are only some aspects of the present disclosure, and are not intended to limit the present disclosure. Any modification, equivalent replacement and improvement made without departing from the motivation and principle of the present disclosure shall be included in its scope.

The invention claimed is:

1. A cabinet for installing electronic components of magnetic resonance imaging equipment, comprising:
   a cabinet body, having at least a plurality of electronic components installed therein;
   a cooling cabinet configured to provide cooling to the plurality of electronic components installed in the cabinet body;
   a water cooler having a water cooling loop, which is constructed in an upper part of the cooling cabinet, and driving devices thereof are constructed in the cooling cabinet, wherein the water cooling loop is configured to divide the cabinet body into a first cabinet space and a second cabinet space, and the electronic components are arranged along the first cabinet space and the second cabinet space; and
   an air cooler, arranged in a lower part of the cooling cabinet and constructed along a central axis of the water cooler, and having at least a fan, wherein, on a first side, the fan is configured to generate a first air flow, which is sent to the first cabinet space through a first air path, and a second air flow, which is sent to the second cabinet space through a second air path, and after the first air flow flows through the first cabinet space and/or the second air flow flows through the second cabinet space, the first air flow and/or the second air flow are guided into the water cooling loop for heat exchange under a suction action of the fan on a second side, and then the first air flow and/or the second air flow are directed into the air cooler after heat exchange with the water cooling loop.

2. The cabinet as claimed in claim 1,
   wherein at least two first openings are opened in the cooling cabinet on both sides of the fan, and the cooling cabinet is connected respectively to the first cabinet space and the second cabinet space through the first openings to form the first air path and the second air path, and
   wherein at least one second opening is opened on either side of the cooling cabinet at an inlet end of the water cooling loop so that the first air flow and the second air flow can pass through the second opening and enter the inlet end.

3. The cabinet as claimed in claim 1, wherein the water cooling loop and the fan are sequentially arranged in the cabinet body from top to bottom, an inlet end is opened on the top of the water cooling loop, an outlet end is opened at the bottom of the water cooling loop, and the fan is arranged according to a position of the outlet end so that the first air flow and/or the second air flow generated by the fan are/is introduced into the first cabinet space and/or the second cabinet space from the bottom of the cabinet body, and enter(s) the water cooling loop from the top of the cabinet body through the inlet end of the water cooling loop for heat exchange.

4. The cabinet as claimed in claim 1, wherein the air cooler comprises:
   a heat exchanger arranged between the fan and an outlet end of the water cooling loop,
   wherein the heat exchanger has a cross section the same size as the cross section of the cooling cabinet, and separates the fan from the water cooling loop so that the first air flow and/or the second air flow are/is introduced into the heat exchanger after passing through the water cooling loop, and so that the first air flow and/or the second air flow are/is directed back to the fan from the heat exchanger.

5. The cabinet as claimed in claim 4, wherein the heat exchanger and the water cooling loop are interconnected by a removable connector.

6. The cabinet as claimed in claim 4, wherein the fan is configured to suck the air flow from the side facing the heat exchanger and deliver the air flow to the side facing away from the heat exchanger.

7. The cabinet as claimed in claim 1, further comprising:
   a power distribution system installed in the first cabinet space or the second cabinet space,
   wherein the fan is electrically connected to the power distribution system through a pluggable electrical connection line, and the power distribution system is configured to supply power to the fan.

8. A magnetic resonance imaging system, comprising:
   the cabinet as claimed in claim 1, wherein a gradient power amplifier that is included in the magnetic resonance imaging system is independently placed in the first cabinet space or the second cabinet space.

* * * * *